(12) United States Patent
Kim

(10) Patent No.: US 9,331,676 B2
(45) Date of Patent: May 3, 2016

(54) PULSE SIGNAL GENERATION CIRCUIT AND OPERATING METHOD THEREOF

(71) Applicant: SK hynix Inc., Gyeonggi-do (KR)

(72) Inventor: Jung-Hyun Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/610,768

(22) Filed: Jan. 30, 2015

(65) Prior Publication Data

US 2015/0145573 A1 May 28, 2015

Related U.S. Application Data

(62) Division of application No. 13/842,043, filed on Mar. 15, 2013, now Pat. No. 8,975,932.

(30) Foreign Application Priority Data

Dec. 28, 2012 (KR) .................. 10-2012-0157254

(51) Int. Cl.
*H03K 3/017* (2006.01)
*H03K 5/04* (2006.01)

(52) U.S. Cl.
CPC . *H03K 3/017* (2013.01); *H03K 5/04* (2013.01)

(58) Field of Classification Search
CPC ........... H03K 3/017; H03K 5/04; H03K 7/08; H03K 5/1534; H03K 5/1565; H03K 5/26; H03K 5/159
USPC .................. 327/172, 173, 174, 175
See application file for complete search history.

(56) References Cited

U.S. PATENT DOCUMENTS

| 5,723,989 A * | 3/1998 | Steinlechner .......... G01R 25/08 327/2 |
| 2007/0030754 A1* | 2/2007 | Gomm ................. G11C 7/1072 365/233.13 |

* cited by examiner

*Primary Examiner* — John Poos
(74) *Attorney, Agent, or Firm* — IP & T Group LLP

(57) ABSTRACT

The present invention relates to a pulse signal generation circuit for changing a pulse width of an input pulse signal and outputting an output pulse signal having the changed pulse width. In an aspect, the pulse signal generation circuit may include a control signal generator configured to generate at least one control signal according to a pulse width of a input pulse signal and a pulse signal generator configured to control a pulse width of an input pulse signal in response to a control signal and to generate an output pulse signal with the controlled pulse width. The control signal controls the pulse width of the output pulse signal.

3 Claims, 6 Drawing Sheets

PULSE SIGNAL GENERATION CIRCUIT AND OPERATING METHOD THEREOF

CROSS-REFERENCE TO RELATED APPLICATIONS

This application is a division of U.S. patent application Ser. No. 13/842,043 filed on Mar. 15, 2013, which claims priority of Korean Patent Application No. 10-2012-0157254, filed on Dec. 28, 2012. The disclosure of each of the foregoing application is incorporated herein by reference in its entirety.

BACKGROUND

1. Field

Exemplary embodiments of the present invention relate to semiconductor design technology, and more particularly, to a pulse signal generation circuit for adjusting a pulse width of an input pulse signal and outputting an output pulse signal having the changed pulse width.

2. Description of the Related Art

A semiconductor memory device, such as double data rate synchronous DRAM (DDR SDRAM), includes a variety of internal circuits for performing a variety of operations. One of the internal circuits is a pulse signal generation circuit for generating a pulse signal.

FIG. 1 is a circuit diagram of a conventional pulse signal generation circuit.

Referring to FIG. 1, the pulse signal generation circuit includes a delay unit 110 and an output unit 120.

The delay unit 110 incorporates a predetermined amount of delay into an input pulse signal SIG_IN and outputs a delayed signal. The amount of delay incorporated by the delay unit 110 is one of important factors that determine a pulse width of an output pulse signal SIG_OUT. The output unit 120 generates the output pulse signal SIG_OUT in response to a signal SIG_A inverted from the input pulse signal SIG_IN and the signal SIG_B from the delay unit 110.

FIG. 2 is a timing diagram illustrating the operation of the pulse signal generation circuit of FIG. 1, where the amount of delay of the delay unit 110 is indicated by 'DY'.

Referring to FIGS. 1 and 2, the delay unit 110 delays the input pulse signal SIG_IN by the amount of delay DY and outputs the signal 'SIG_B'. The output pulse signal SIG_OUT is generated in response to the signal 'SIG_A' and the signal 'SIG_B'. As can be seen from the figure, the pulse width of the output pulse signal SIG_OUT is equal to the pulse width of the input pulse signal SIG_IN plus the amount of delay DY.

With the recent development of the process and design technologies of semiconductor memory devices, a semiconductor memory device operates at a very high speed, which requires a clock signal having a high frequency. This means that the pulse width of the clock signal needs to become smaller. A clock signal provides a reference in the operation to a semiconductor memory device. That is, a semiconductor memory device internally generates a pulse signal with reference to the pulse width of a clock signal.

As described above, as the pulse width of a clock signal becomes smaller, the pulse width of a pulse signal becomes smaller. Accordingly, the following concerns arise.

According to prior art, for generation of a pulse signal, the amount of delay DY of the delay unit 110 has to be smaller than the pulse width of the input pulse signal SIG_IN. If the amount of delay DY of the delay unit 110 is greater than the pulse width of the input pulse signal SIG_IN, the output pulse signal SIG_OUT has two pulses. For this reason, the amount of delay DY must be designed very precisely for generation of the pulse signal as the pulse width of a clock signal becomes smaller.

However, the design of a pulse signal generation circuit is becoming more difficult because an influence due to a PVT (process, voltage, and temperature) and a gradual decrease in the pulse width of the input pulse signal SIG_IN should be reflected to a design of an inverter chain in the delay unit.

SUMMARY

Embodiments of the present invention are directed to providing a pulse signal generation circuit capable of adjusting a pulse width of an output pulse signal in response to variation of a pulse width of an input pulse signal.

In accordance with an embodiment of the present invention, a pulse signal generation circuit may include a control signal generator configured to generate at least one control signal according to a pulse width of a input pulse signal, and a pulse signal generator configured to control a pulse width of an input pulse signal in response to a control signal and to generate an output pulse signal with the controlled pulse width. The control signal controls the pulse width of the output pulse signal.

The pulse signal generator preferably may include a plurality of delay units configured to incorporate a preset delay time into the input pulse signal and a pulse output unit configured to output the output pulse signal in response to output signals of the plurality of delay units.

In accordance with another embodiment of the present invention, a pulse signal generation circuit may include a first edge detection unit configured to detect the deactivation edge of an input pulse signal having a pulse width defined by an activation edge and the deactivation edge, a shifting unit configured to shift the input pulse signal in response to the output signal of the first edge detection unit, a second edge detection unit configured to detect the deactivation edge of the output signal of the shifting unit, and a pulse generation unit configured to generate an output pulse signal in response to the input pulse signal and the output signal of the second edge detection unit.

The pulse generation unit preferably may be set in response to the input pulse signal and reset in response to the output signal of the second edge detection unit.

In accordance with yet another embodiment of the present invention, an operating method of a pulse signal generation circuit may include detecting a second activation edge of an input pulse signal having a pulse width defined by a first activation edge and the second activation edge, delaying the input pulse signal by a time corresponding to the second activation edge, and generating an output pulse signal having a pulse width defined by the input pulse signal and a result signal by the delaying of the input pulse signal by a time corresponding to the second activation edge.

The delaying of the input pulse signal by a time corresponding to the second activation edge preferably may shift the input pulse signal by a time corresponding to the second activation edge.

In accordance with yet another embodiment of the present invention, a pulse signal generation circuit may include a pulse signal generator configured to sequentially shift an input pulse signal by a preset amount, and to generate an output pulse signal based on the input pulse signal and at least one delay signal that is a sequentially shifted version of the input pulse signal, and a control signal generator configured to control the sequential shift based on the deactivation edge of the input pulse signal.

The pulse signal generation circuit in accordance with one embodiment of the present invention may generate a stable output pulse signal by adjusting a pulse width of an output pulse signal in response to a pulse width of an input pulse signal.

DETAILED DESCRIPTION

Figure 1:
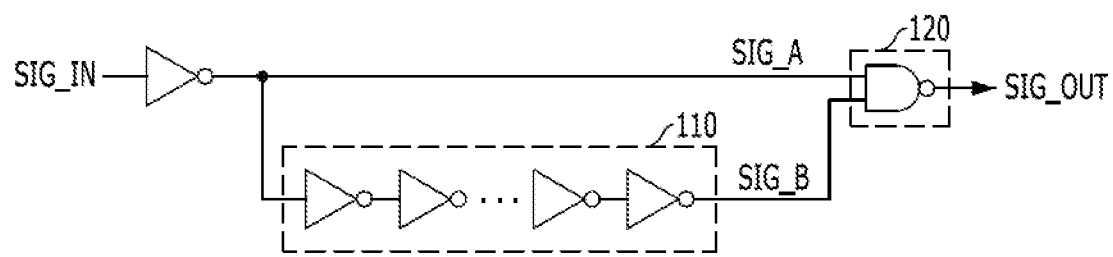
FIG. 1 is a circuit diagram of a conventional pulse signal generation circuit.
Figure 2:
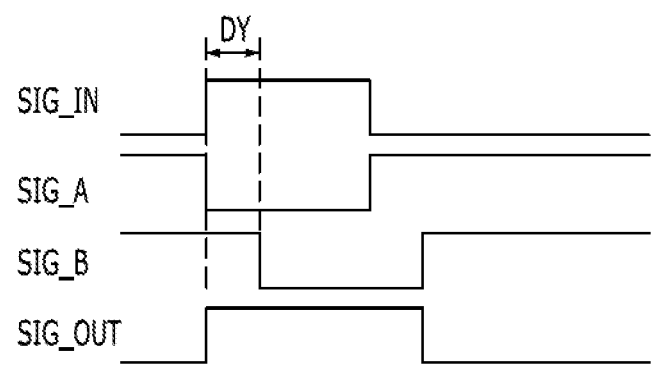
FIG. 2 is a timing diagram illustrating the operation of the pulse signal generation circuit shown in FIG. 1.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention. In addition, a singular form may include a plural form as long as it is not specifically mentioned in a sentence.

Figure 3:
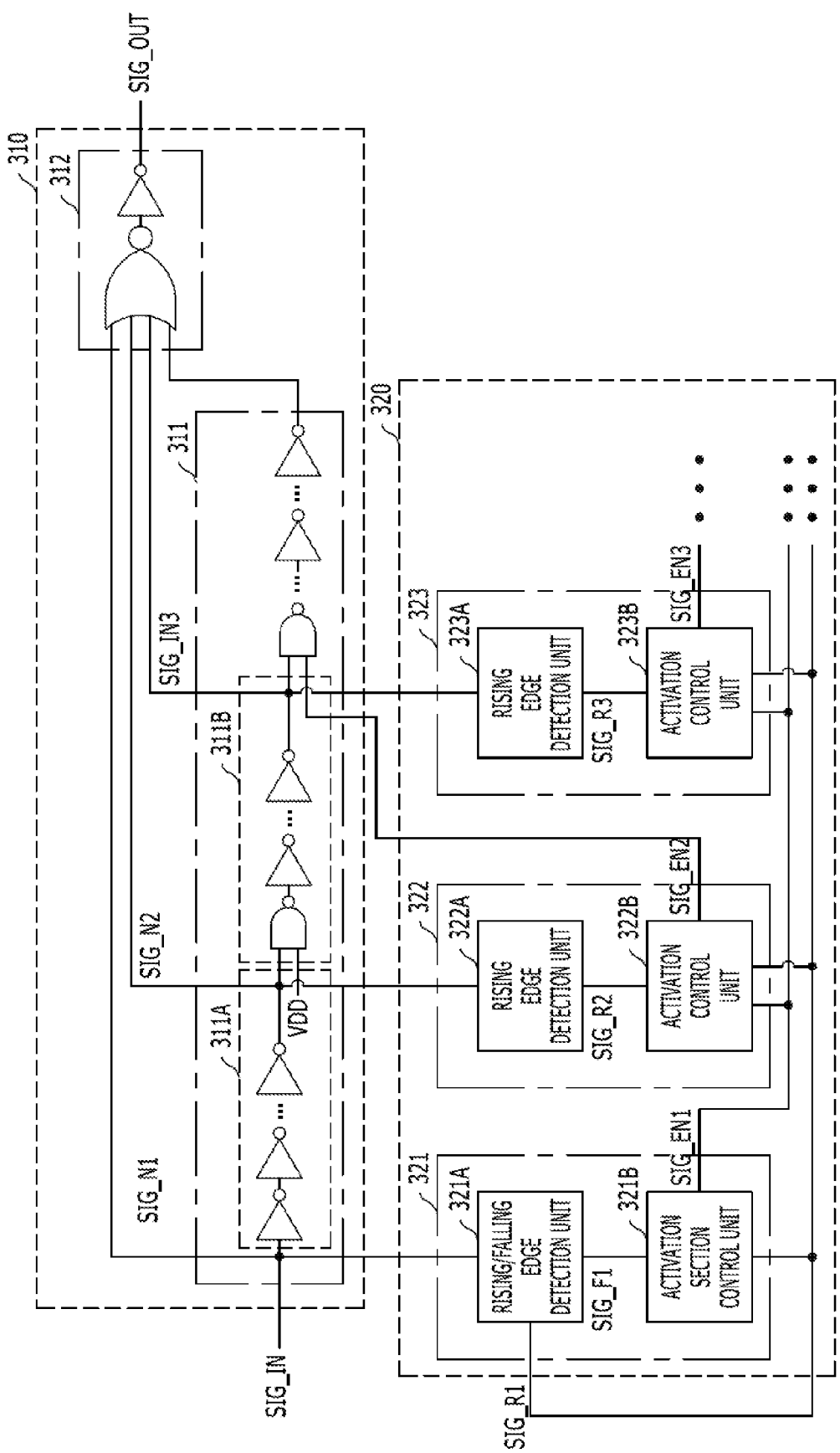
FIG. 3 is a block diagram of a pulse signal generation circuit in accordance with an embodiment of the present invention.

FIG. 3 is a block diagram of a pulse signal generation circuit in accordance with an embodiment of the present invention.

Referring to FIG. 3, the pulse signal generation circuit includes a pulse signal generator 310 and a control signal generator 320.

The pulse signal generator 310 generates an output pulse signal SIG_OUT in response to a plurality of activation control signals e.g. SIG_EN1, SIG_EN2, and SIG_EN3 (hereinafter referred as SIG_EN1, SIG_EN2, and SIG_EN3) by controlling the pulse width of an input pulse signal SIG_IN. The control signal generator 320 generates the plurality of activation control signals SIG_EN1, SIG_EN2, and SIG_EN3 that are activated based on rising and falling edge of the input pulse signal SIG_IN.

The pulse signal generator 310 includes a plurality of delay units 311 for incorporating a preset delay time into the input pulse signal SIG_IN and a pulse output unit 312 for outputting the output pulse signal SIG_OUT based on the output signals e.g. SIG_N2 and SIG_N3 (hereinafter referred as SIG_N2 and SIG_N3) of the delay unit 311 and the input pulse signal SIG_IN.

The control signal generator 320 generates the activation control signals SIG_EN2 and SIG_EN3 for controlling the pulse signal generator 310 and includes a first control signal generation unit 321 for generating the activation control signal SIG_EN1, a second control signal generation unit 322 for generating the second activation control signal SIG_EN2, and a third control signal generation unit 323 for generating the third activation control signal SIG_EN3. The structures and operations of the first to third control signal generation units 321, 322, and 323 are described in detail with reference to FIGS. 5 to 8.

Figure 4:
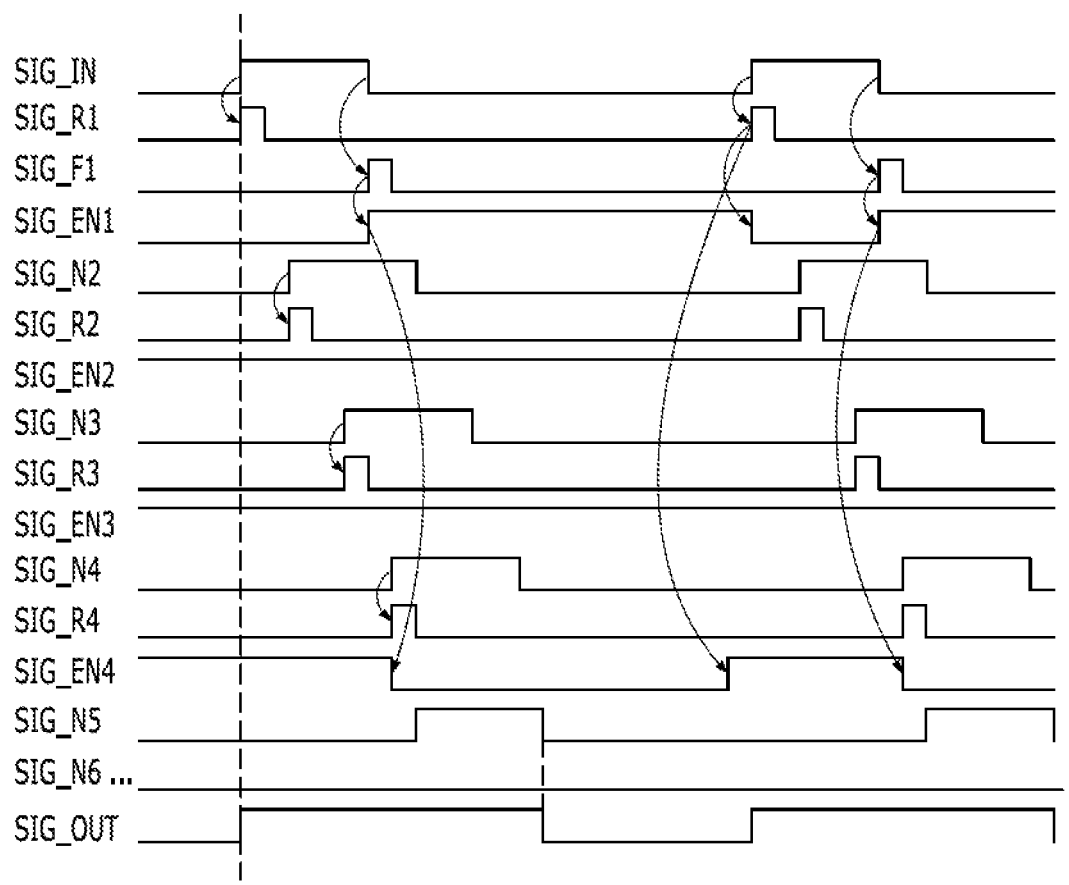
FIG. 4 is a timing diagram illustrating the operation of the pulse signal generation circuit shown in FIG. 3.

FIG. 4 is a timing diagram illustrating the operation of the pulse signal generation circuit shown in FIG. 3.

Referring to FIG. 4, when the input pulse signal SIG_IN is inputted, a rising/falling edge detection unit 321A generates a first rising detection signal SIG_R1 according to the rising edge of the input pulse signal SIG_IN and generates a first falling detection signal SIG_F1 according to the falling edge of the input pulse signal SIG_IN. An activation section control unit 321B shifts the activation control signal SIG_EN1 from a logic 'LOW' to a logic 'HIGH' in response to the first falling detection signal SIG_F1, and from a logic 'HIGH' to a logic 'LOW' in response to the first rising detection signal SIG_R1. The other activation control units 322B and 323B are reset in response to the first rising detection signal SIG_R1. That is, the second and third activation control signals SIG_EN2 and SIG_EN3 outputted from the activation control units 322B and 323B shift to a logic 'HIGH'.

Meanwhile, the input pulse signal SIG_IN is delayed by a first delay unit 311A by a preset time and outputted as an output signal SIG_N2 to the next delay unit or a second delay unit 311B. A rising edge detection unit 322A generates a second rising detection signal SIG_R2 according to the rising edge of the output signal SIG_N2 from the first delay unit 311A at which the activation control signal SIG_EN1 inputted to the activation control unit 322B maintains a logic 'LOW', and the second activation control signal SIG_EN2 generated from the activation control unit 322B maintains a logic 'HIGH'. Accordingly, a second delay unit 311B transfers the delayed input pulse signal SIG_IN or an output signal SIG_N3 from the first delay unit 311A to a next stage with another preset delay time.

A series of the operations described above are performed until a time point of the falling edge of the input pulse signal SIG_IN. The output pulse signal SIG_OUT is generated in response to the output signals SIG_N2, SIG_N3, SIG_N4 and SIG_N5 that are generated during the activation of the input pulse signal SIG_IN. The pulse signal generation circuit in accordance with one embodiment of the present invention may detect the falling edge of the input pulse signal SIG_IN and generate the output pulse signal SIG_OUT having a pulse width based on a result of the detection, which means that the pulse width of the output pulse signal SIG_OUT according to the embodiment of the present invention may be adjusted in response to variation of the pulse width of the input pulse signal SIG_IN.

Figure 5:
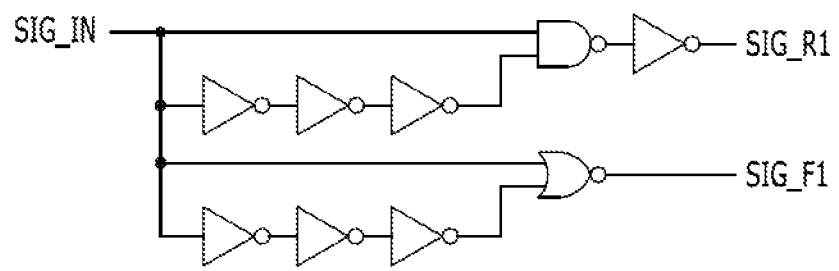
FIG. 5 is a circuit diagram illustrating a rising/falling edge detection unit shown in FIG. 4.

FIG. 5 is a circuit diagram of the rising/falling edge detection unit 321A shown in FIG. 4.

Referring to FIG. 5, the rising/falling edge detection unit 321A generates the first rising detection signal SIG_R1 having a predetermined pulse width according to the rising edge of the input pulse signal SIG_IN and generates the first falling detection signal SIG_F1 having a predetermined pulse width according to the falling edge of the input pulse signal SIG_IN.

Figure 6:
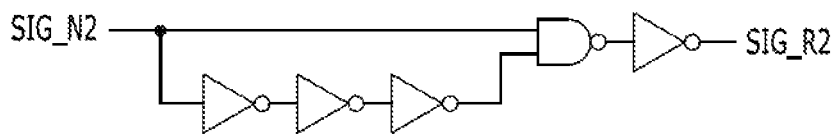
FIG. 6 is a circuit diagram illustrating a rising edge detection unit shown in FIG. 4.

FIG. 6 is a circuit diagram of the rising edge detection unit 322A shown in FIG. 4. The rising edge detection unit 322A has substantially the same structure and operation as each of the rising edge detection units of the plural control signal generators shown as an example 322, and 323 shown in FIG. 4.

Referring to FIG. 6, the rising edge detection unit 322A generates the second rising detection signal SIG_R2 having a predetermined pulse width according to the rising edge of the output signal SIG_N2 inputted from the first delay unit 311A.

Figure 7:
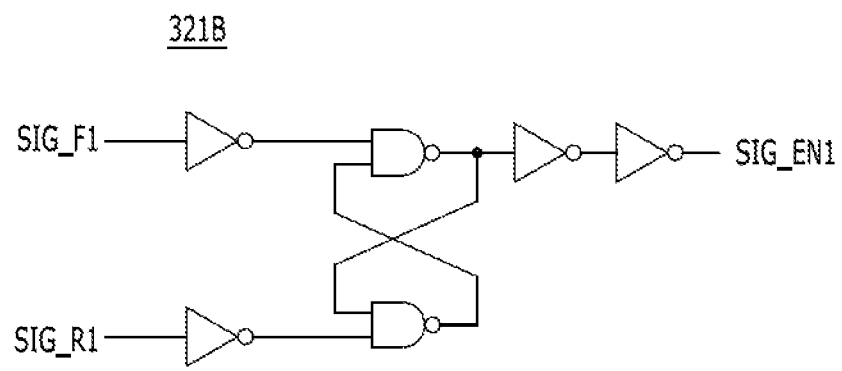
FIG. 7 is a circuit diagram illustrating an activation section control unit shown in FIG. 4.

FIG. 7 is a circuit diagram of the activation section control unit 321B shown in FIG. 4.

Referring to FIG. 7, the activation section control unit 321B generates the activation control signal SIG_EN1 that shifts to a logic 'LOW' in response to the first rising detection signal SIG_R1 and shifts to a logic 'HIGH' in response to the first falling detection signal SIG_F1.

Figure 8:
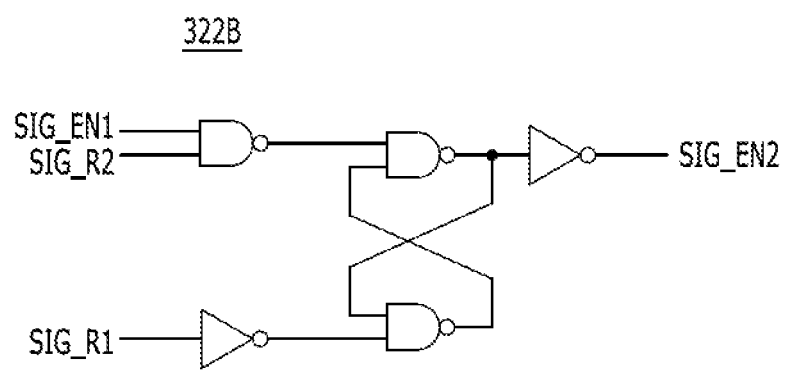
FIG. 8 is a circuit diagram illustrating an activation control unit shown in FIG. 4.

FIG. 8 is a circuit diagram of the activation control unit 322B shown in FIG. 4. The activation control unit 322B has the same structure and operation as each of the activation control units of the plural control signal generators shown as an example 322 and 323 in FIG. 4.

Referring to FIG. 8, the activation control unit 322B generates the second activation control signal SIG_EN2 that shifts to a logic 'HIGH' in response to the first rising detection signal SIG_R1 and shifts to a logic 'LOW' in response to the activation control signal SIG_EN1 or the second rising detection signal SIG_R2.

Figure 9:
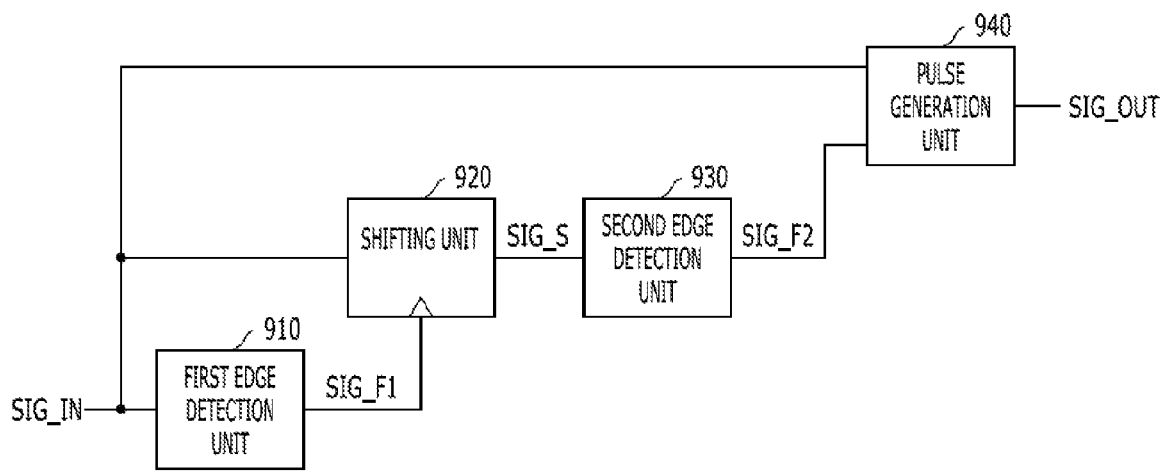
FIG. 9 is a block diagram illustrating a pulse signal generation circuit in accordance with another embodiment of the present invention.

FIG. 9 is a block diagram of a pulse signal generation circuit in accordance with another embodiment of the present invention.

Referring to FIG. 9, the pulse signal generation circuit includes a first edge detection unit 910, a shifting unit 920, a second edge detection unit 930, and a pulse generation unit 940.

The first edge detection unit 910 generates a first falling detection signal SIG_F1 according to the falling edge of an input pulse signal SIG_IN. The shifting unit 920 shifts the input pulse signal SIG_IN with preset amount of shift in response to the first falling detection signal SIG_F1 to generate the shifted input pulse signal or a output signal SIG_S. The second edge detection unit 930 generates a second falling detection signal F2 according to the falling edge of the output signal SIG_S of the shifting unit 920. The pulse generation unit 940 generates an output pulse signal SIG_OUT in response to the input pulse signal SIG_IN and the second falling detection signal F2.

Figure 10:
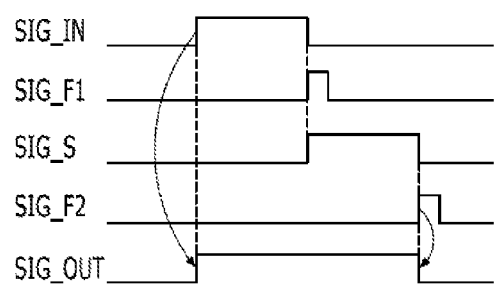
FIG. 10 is a timing diagram illustrating the operation of the pulse signal generation circuit show in FIG. 9.

FIG. 10 is a timing diagram illustrating the operation of the pulse signal generation circuit shown in FIG. 9.

Referring to FIGS. 9 and 10, first, the first edge detection unit 910 to which the input pulse signal SIG_IN is inputted generates the first falling detection signal SIG_F1 according to the falling edge of the input pulse signal SIG_IN. The shifting unit 920 shifts the input pulse signal SIG_IN with preset amount of shift in response to the first falling detection signal SIG_F1. The second edge detection unit 930 generates the second falling detection signal F2 according to the falling edge of the output signal SIG_S of the shifting unit 920.

The pulse generation unit 940 generates the output pulse signal SIG_OUT that is set to a logic 'HIGH' in response to the rising edge of the input pulse signal SIG_IN, and reset to a logic 'LOW' in response to the second falling detection signal F2.

The pulse signal generation circuit in accordance with the present embodiment of the present invention may delay the input pulse signal SIG_IN through a shifting operation by the falling edge of the input pulse signal SIG_IN and generate the output pulse signal SIG_OUT by adding a pulse signal, which is generated through the delay, to the input pulse signal SIG_IN.

As described above, the pulse signal generation circuit in accordance with one embodiment of the present invention may control the pulse width of the output pulse signal SIG_OUT by a pulse width of the input pulse signal SIG_IN. Accordingly, even when the input pulse signal SIG_IN has a small pulse width, the output pulse signal SIG_OUT may be stably generated.

Accordingly, there may be advantages in that a stable output pulse signal may be generated and a semiconductor device using a stable output pulse signal may secure a reliable circuit operation.

An operation of the pulse signal generation circuit in accordance with an embodiment of the present invention may include a step of detecting a second activation edge of an input pulse signal SIG_IN having a pulse width defined by a first activation edge and the second activation edge, a step of delaying the input pulse signal SIG_IN by a time corresponding to the second activation edge, and a step of generating an output pulse signal SIG_OUT having a pulse width defined by the input pulse signal SIG_IN and an output signal in the delaying of the input pulse signal SIG_IN by a time corresponding to the second activation edge. The pulse width of the output pulse signal SIG_OUT may be longer than the pulse width of the input pulse signal SIG_IN. At the step of delaying the input pulse signal SIG_IN, the input pulse signal SIG_IN may be shifted by a time corresponding to the second activation edge.

The locations and types of the logic gates and the transistors illustrated in the aforementioned embodiments may be differently implemented depending on the polarity of an input signal.

While the present invention has been described with respect to the specific embodiments, it will be apparent to those skilled in the art that various changes and modifications may be made without departing from the spirit and scope of the invention as defined in the following claims.

What is claimed is:

1. A pulse signal generation circuit, comprising:
   a first edge detection unit configured to detect a deactivation edge of an input pulse signal having a pulse width defined by an activation edge and the deactivation edge;
   a shifting unit configured to shift the input pulse signal in response to an output signal of the first edge detection unit;
   a second edge detection unit configured to detect a deactivation edge of the output signal of the shifting unit; and
   a pulse generation unit configured to generate an output pulse signal in response to the input pulse signal and an output signal of the second edge detection unit.

2. The pulse signal generation circuit of claim 1, wherein the pulse generation unit is set in response to the input pulse signal and reset in response to the output signal of the second edge detection unit.

3. The pulse signal generation circuit of claim 1, wherein a pulse width of the output pulse signal is longer than the pulse width of the input pulse signal.

* * * * *